United States Patent
Sato

(10) Patent No.: US 8,384,089 B2
(45) Date of Patent: Feb. 26, 2013

(54) NITRIDE SEMICONDUCTOR DEVICE AND METHOD OF MANUFACTURING THE SAME

(75) Inventor: Ken Sato, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 57 days.

(21) Appl. No.: 13/030,443

(22) Filed: Feb. 18, 2011

(65) Prior Publication Data

US 2011/0204379 A1    Aug. 25, 2011

(30) Foreign Application Priority Data

Feb. 22, 2010    (JP) ................. 2010-035950

(51) Int. Cl.
*H01L 29/778*    (2006.01)
*H01L 21/20*    (2006.01)
*H01L 21/30*    (2006.01)

(52) U.S. Cl. ............ 257/76; 257/E21.09; 257/E29.246; 438/478; 438/746

(58) Field of Classification Search .................. None
See application file for complete search history.

(56) References Cited

U.S. PATENT DOCUMENTS

| | | | |
|---|---|---|---|
| 7,795,642 B2 * | 9/2010 | Suh et al. ...................... | 257/194 |
| 8,164,117 B2 * | 4/2012 | Sato ............................. | 257/194 |
| 2002/0139995 A1 * | 10/2002 | Inoue et al. .................... | 257/194 |
| 2006/0043416 A1 * | 3/2006 | P. Li et al. ..................... | 257/192 |
| 2006/0060871 A1 * | 3/2006 | Beach .............................. | 257/94 |
| 2008/0093626 A1 * | 4/2008 | Kuraguchi .................... | 257/190 |
| 2010/0270559 A1 * | 10/2010 | Ota ................................. | 257/76 |

FOREIGN PATENT DOCUMENTS

JP    2005235935 A    9/2005
WO    WO 2009-066434    *    5/2009

OTHER PUBLICATIONS

Maher, H., D. W. DiSanto, G. Soerensen, C. R. Bolognesi, H. Tang, and J. B. Webb. "Smooth Wet Etching by Ultraviolet-assisted Photoetching and Its Application to the Fabrication of AlGaN/GaN Heterostructure Field-effect Transistors." Applied Physics Letters 77.23 (2000): 3833.*

Jintong Xu, Jie Chen, Zhiguo Su, Yan Zhang and Xiangyang Li, "Wet chemical etching of Al0.65Ga0.35N in aqueous KOH solutions", Proc. SPIE 7518, 751818 (2009).*

* cited by examiner

*Primary Examiner* — Thomas L Dickey
*Assistant Examiner* — Joseph Schoenholtz
(74) *Attorney, Agent, or Firm* — Wilmer Cutler Pickering Hale and Dorr LLP

(57)    ABSTRACT

A nitride semiconductor device including: a substrate; a nitride semiconductor layer formed on the substrate and having a heterojunction interface; and a recess portion formed on the nitride semiconductor layer, wherein the nitride semiconductor layer includes: a carrier transit layer, which has a composition represented by the formula: $Al_{x1}In_{x2}Ga_{1-x1-x2}N$, ($0 \leq x1 \leq 1$, $0 \leq x2 \leq 1$, $0 \leq (x1+x2) \leq 1$); and a carrier supply layer including: a first layer formed on the carrier transit layer, said first layer having a composition represented by the formula: $Al_yGa_{1-y}N$, ($0 < y \leq 1$, $x1 < y$); a second layer formed on the first layer, said second layer containing GaN; and a third layer formed on the second layer, said third layer having a composition represented by the formula: $Al_zGa_{1-z}N$, ($0 < z \leq 1$, $x1 < z$), and wherein the recess portion is formed to penetrate the third layer and expose a surface of the second layer at a bottom portion of the recess portion.

10 Claims, 6 Drawing Sheets

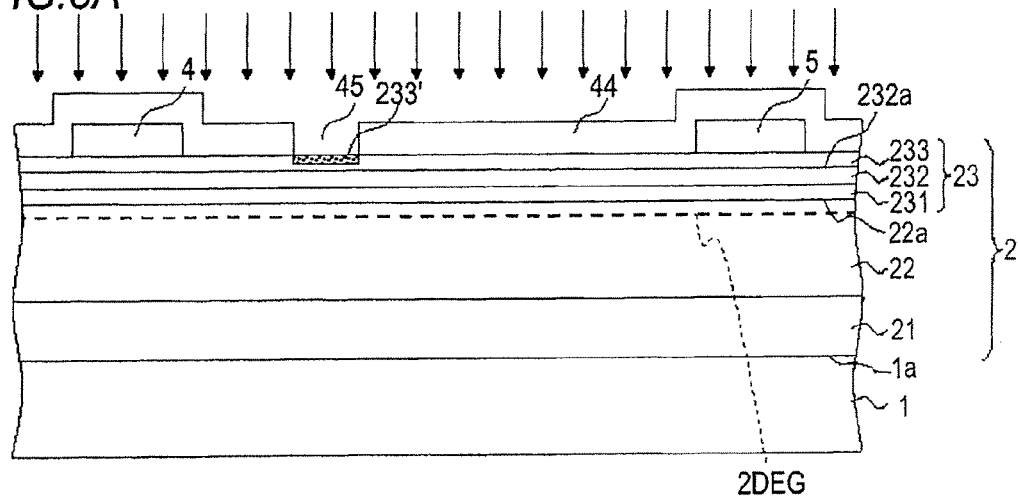
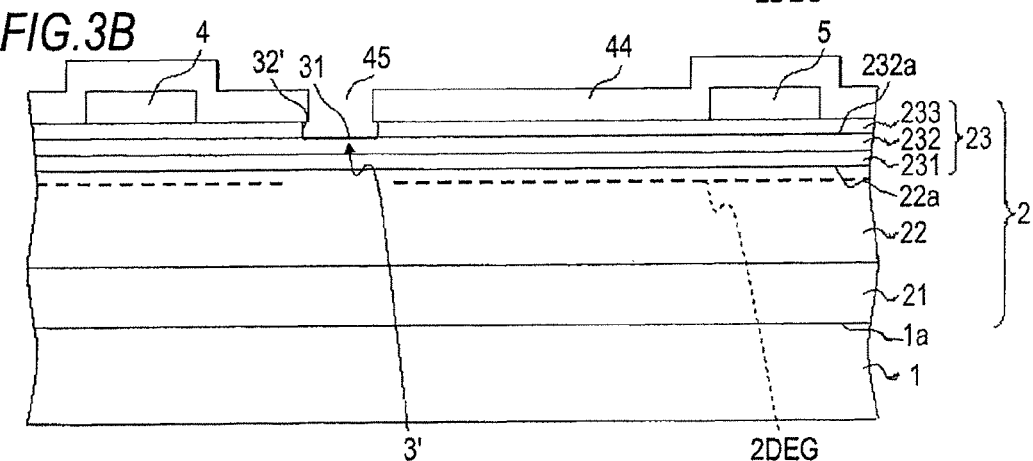
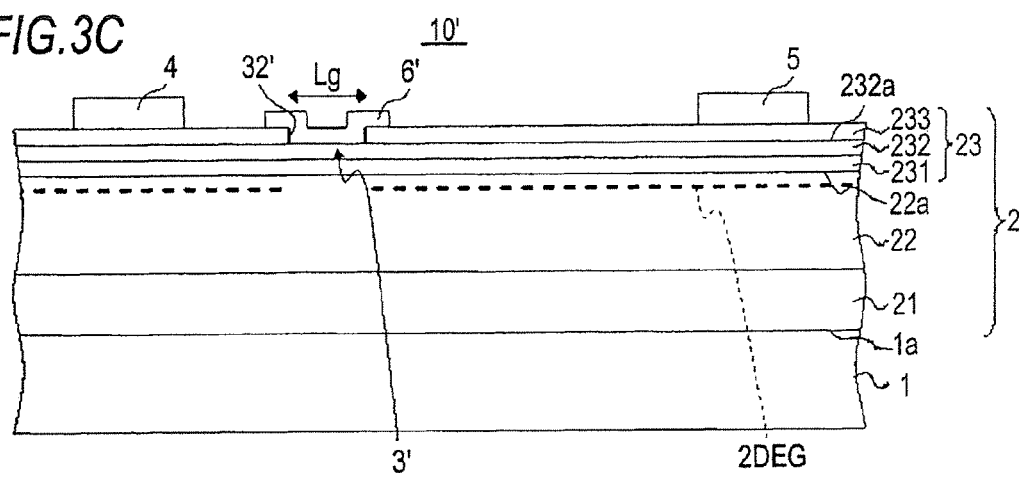

NITRIDE SEMICONDUCTOR DEVICE AND METHOD OF MANUFACTURING THE SAME

CROSS-REFERENCE TO RELATED APPLICATION

This application claims priority from Japanese Patent Application No. 2010-035950 filed on Feb. 22, 2010, the entire subject matter of which is incorporated herein by reference.

BACKGROUND

1. Technical Field

The present invention relates to a nitride semiconductor device and a method of manufacturing the same, and, specifically, relates to a field-effect transistor (FET) having normally-off characteristics and the method of manufacturing the same.

2. Background

A high electron mobility transistor (HEMT) using a nitride semiconductor such as gallium nitride (GaN) is expected as a device having high voltage and high speed due to its material properties. It is important to improve the normally-off characteristic, which means stopping the flow of electric current without gate bias applied, in order to achieve the high speed performance of the HEMT.

FIG. 4 is a sectional view illustrating the structure of a HEMT 110 according to the related art disclosed in JP-A-2005-235935. The related art discloses the HEMT 110 including a substrate 101, a semiconductor layer 102 having a buffer layer 121, an electron transit layer 122 and an electron supply layer 123, a source electrode 104, drain electrode 105, and a gate electrode 106 formed within a recess portion 103. In the HEMT 110 described in JP-A-2005-235935, the recess portion 103 is formed by making a portion of the electron supply layer 123 thinner with dry etching.

SUMMARY

Meanwhile, it is known that the thickness of the portion of the electron supply layer 123, which remains right under the recess portion 103, have great influence on the normally-off characteristic. When the recess portion 103 is formed by dry etching as disclosed in the related art, the uneven thickness of the electron supply layer 123 easily causes the variation of the threshold value, and thus a stable HEMT having the normally-off characteristic may not be stably acquired.

Therefore the present invention provides a nitride semiconductor device stably achieving a stable normally-off characteristic.

With considering the above, a nitride semiconductor device according to the present invention includes: a substrate; a nitride semiconductor layer formed on the substrate and having a heterojunction interface; and a recess portion formed on the nitride semiconductor layer, wherein the nitride semiconductor layer includes: a carrier transit layer, which has a composition represented by the formula: $Al_{x1}In_{x2}Ga_{1-x1-x2}N$, wherein x1 satisfies $0 \leq x1 < 1$, wherein x2 satisfies $0 \leq x2 \leq 1$, wherein x1+x2 satisfies $0 \leq x1+x2 \leq 1$; and a carrier supply layer including: a first layer formed on the carrier transit layer, said first layer having a composition represented by the formula: $Al_yGa_{1-y}N$, wherein y satisfies $0 < y \leq 1$ and x1<y; a second layer formed on the first layer, said second layer containing GaN; and a third layer formed on the second layer, said third layer having a composition represented by the formula: $Al_zGa_{1-z}N$, wherein z satisfies $0 < z \leq 1$ and x1<z, and wherein the recess portion is formed to penetrate the third layer and expose a surface of the second layer at a bottom portion of the recess portion.

Further, with considering the above, a method of manufacturing a nitride semiconductor device, which includes: a substrate; a nitride semiconductor layer formed on the substrate and having a heterojunction interface; and a recess portion formed on the nitride semiconductor layer, the method comprising; forming the nitride semiconductor layer by: forming a carrier transit layer, which has a composition represented by the formula: $Al_{x1}In_{x2}Ga_{1-x1-x2}N$, wherein x1 satisfies $0 \leq x1 < 1$, wherein x2 satisfies $0 \leq x2 \leq 1$, wherein x1+x2 satisfies $0 \leq x1+x2 \leq 1$; and forming a carrier supply layer by: forming a first layer on the carrier transit layer, said first layer having a composition represented by the formula: $Al_yGa_{1-y}N$, wherein y satisfies $0 < y \leq 1$ and x1<y; forming a second layer formed on the first layer, said second layer containing GaN; and forming a third layer formed on the second layer, said third layer having a composition represented by the formula: $Al_zGa_{1-z}N$, wherein z satisfies $0 < z \leq 1$ and x1<z, and forming the recess portion to penetrate the third layer and expose a main surface of the second layer at a bottom portion of the recess portion.

According to the nitride semiconductor device and the method of manufacturing the same of the present invention, the stabled normally-off characteristic is achieved because they suppress the variation of the threshold value caused by a uneven thickness of the electron supply layer. The present invention also provides a nitride semiconductor device suppressing the gate leakage current.

BRIEF DESCRIPTION OF THE DRAWINGS

FIGS. 3A to 3C are procedural sectional views illustrating a method of manufacturing the HEMT according to second illustrative aspect of the present invention.

DESCRIPTION OF PREFERRED ILLUSTRATIVE ASPECTS

Hereinafter, aspects of a nitride semiconductor device and a method of manufacturing the same according to the present invention is explained in detail with reference to the accompanying drawings. The same or similar reference numbers are used to refer to the same or similar parts herein. The drawings are schematic and may not exactly actual products. Further, the dimensions or ratios of the parts may not represent actual products and may vary in different drawings accompanied herein.

[First Illustrative Aspect]

(Configuration of Nitride Semiconductor Device)

Figure 1:
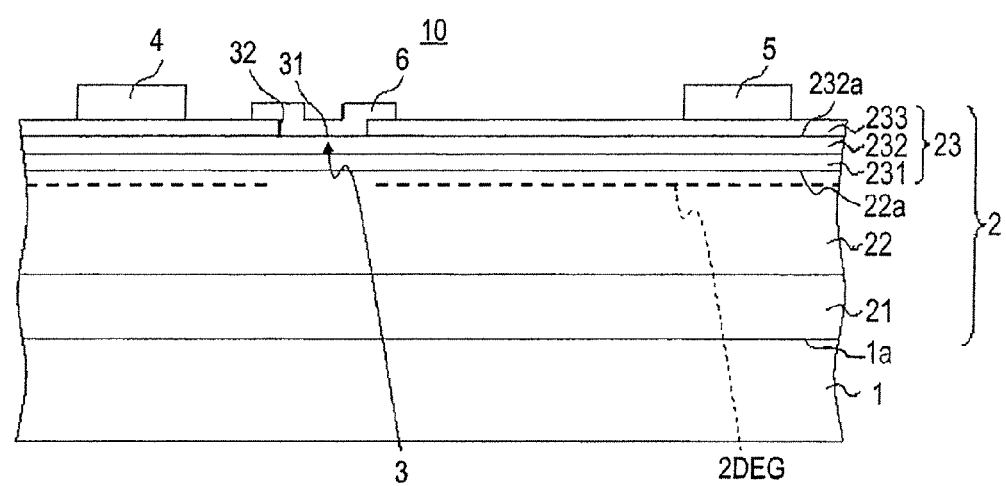
FIG. 1 is a sectional view illustrating the structure of the HEMT according to first illustrative aspect of the present invention.

FIG. 1 is a sectional view illustrating the structure of a HEMT 10 according to first illustrative aspect of the present invention, The HEMT 10, as a nitride semiconductor device according to the present invention, includes a substrate 1, a nitride semiconductor layer 2, and a recess portion 3.

The substrate 1 is a single crystal substrate made of such materials as silicon (Si), silicon carbide (SiC), gallium nitride (GaN), or sapphire. In this illustrative aspect, the substrate 1 is made of silicon single crystal and has a main surface 1a.

The nitride semiconductor 2 has a multilayer structure, which is formed by epitaxial-grown on the main surface 1a of the substrate 1, and includes heterojunction interface 22a and a two-dimensional electron gas layer (2DEG) adjacent to the interface 22a. The nitride semiconductor 2 further includes a buffer layer 21, a carrier transit layer 22, and a carrier supply layer 23.

The carrier transit layer 22 is made of, for example, non-doped $Al_{x1}In_{x2}Ga_{1-x1-x2}N$ (aluminum Indium gallium nitride), and has a thickness of about 3.0 to 4.5 μm. Herein, the term "non-doped" means a state that impurities are not introduced intentionally. Further, a range of the sum of a symbol "x1" and a symbol "x2" is equal to or more than 0 and is equal to or less than 1. For example, is equal to or more than 0 and is less than 1, but x1 is zero in this illustrative aspect. Further, x2 is equal to or more than 0 and is equal to or less than 1, and x2 is zero in this illustrative aspect. In other words, in this illustrative aspect, the carrier transit layer 22 is made of GaN.

The carrier supply layer 23 has a larger band gap than the carrier transit layer 22, and has a smaller lattice constant than the carrier transit layer 22. In this illustrative aspect, the carrier supply layer 23 is formed on the carrier transit layer 22, and includes a first layer 231, a second layer 232, and a third layer 233. Each layer of the carrier transit layer 22 is made with a composition and a layer thickness, which will be described below, so that the 2DEG right under the recess portion 3 is to be vanished.

The second layer 232, which is formed on the first layer 231, is made of n-type GaN doped with Si as a conductive impurity, and has a thickness of about 2 to 5 nm. The second layer 232 may be made of non-doped GaN. Moreover, it is preferable in the present invention that a main surface 232a of the second layer 232 is a C-plane (Miller index (0001) plane) of GaN. As explained below, the main surface 232a of the second layer 232 is exposed at the bottom portion 31 of the recess portion 3, and the second layer 232 is adjacent to the gate electrode 6 there.

The third layer 233, which is formed on the second layer 232, is made of non-doped $Al_zGa_{1-z}N$, and has a thickness of about 10 to 20 nm. Here, the value of z ranges, for example, from 0 (excluding 0) to 1 (including 1). Preferably, the value of z is more than 0.3 and is less than 0.5 and is also less than the value of y, but the value of z is 0.3 in this illustrative aspect. Further, the third layer 233 may have a cap layer formed thereon, the cap layer being made of GaN. The third layer 233 also has an opening configuring the recess portion 3 in the nitride semiconductor layer 2.

The recess portion 3 is formed to penetrate the third layer 233. Specifically, a bottom portion 31 of the recess portion 3 is substantially flush with the main surface 232a of the second layer 232, and the side face 32 of the recess portion 3 is consistent with the side face of the third layer 233 that is exposed to the opening side. The first layer 231 and second layer 232 exist between the bottom portion 31 of the recess portion 3 and the carrier transit layer 22. According to the arrangement of the carrier supply layer 23 and the recess portion 3, it possible to split the 2DEG right under the recess portion 3, and the HEMT 10 can acquire the normally-off characteristic.

The HEMT 10 further includes a source electrode 4, a drain electrode 5, and a gate electrode 6. The source electrode 4 is formed on the nitride semiconductor layer 2 to ohmic-contact with the 2DEG. The drain electrode 5 is formed on the nitride semiconductor layer to ohmic-contact with the 2DEG and arranged separate from the source electrode 4. The source electrode 4 and the drain electrode 5 may be formed to contact the carrier transit layer 22. In other words, the source electrode 4 and the drain electrode 5 may be formed as filling in openings penetrating the first layer 231, second layer 232, and third layers and 233.

The gate electrode 6 is arranged between the source electrode 4 and the drain electrode 5, on the nitride semiconductor 2. The gate electrode 6 is formed as filling in the recess portion 3. That is, the gate electrode 6 contacts the second layer 232 at the bottom portion 31 of the recess portion 3 and is adjacent to the third layer 233 at the side face 32 of the recess portion 3.

(Method of Manufacturing Nitride Semiconductor Device)

FIGS. 2A to 2G are procedural sectional views illustrating a method of manufacturing the HEMT according to first illustrative aspect of the present invention. The method of manufacturing the nitride semiconductor device according to the present invention includes a nitride semiconductor forming step and a recess portion forming step.

Figure 2A:
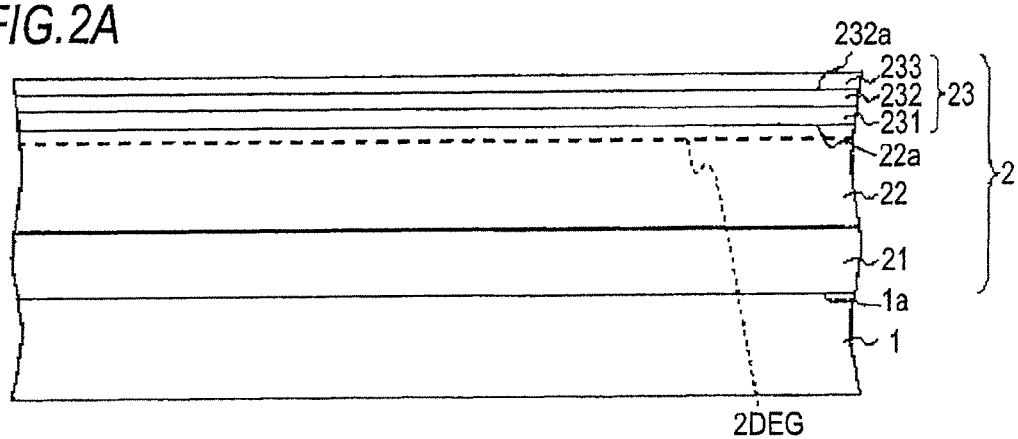
FIGS. 2A to 2G are procedural sectional views illustrating a method of manufacturing the HEMT according to first illustrative aspect of the present invention.

First, as shown in FIG. 2A, the buffer layer 21, the carrier transit layer 22, the first layer 231, the second layer 232, and the third layer 233, all of which belong to the nitride semiconductor layer 2, are formed on the main surface 1a of the substrate 1, in this order. The substrate 1 is made of silicon single crystal and has a (100) plane as the main surface 1a. For example, the substrate 1 is placed within a chamber of a well-known Metal Organic Chemical Vapor Deposition (MOCVD) device, and the nitride semiconductor layer 2 is produced in the way of epitaxial growth by suitably supplying dopant gas into the chamber. The dopant gas contains trimethyl-aluminium (TMA), trimethylgallium (TMG), ammonia ($NH_3$), and silicon (Si), etc. In this illustrative aspect, the buffer layer 21 has the thickness of about 2 μm, the carrier transit layer 22 is about 3.2 μm, the first layer 231 is about 5 nm, the second layer 232 is about 5 nm, and the third layer 233 is about 15 nm. By using the substrate 1 as described above, it possible to easily acquire the second layer 232 having a C-plane as the crystal surface of the main surface 232a, The process illustrated in FIG. 2A is referred to as the nitride semiconductor forming step according to the present invention.

Figure 2B:
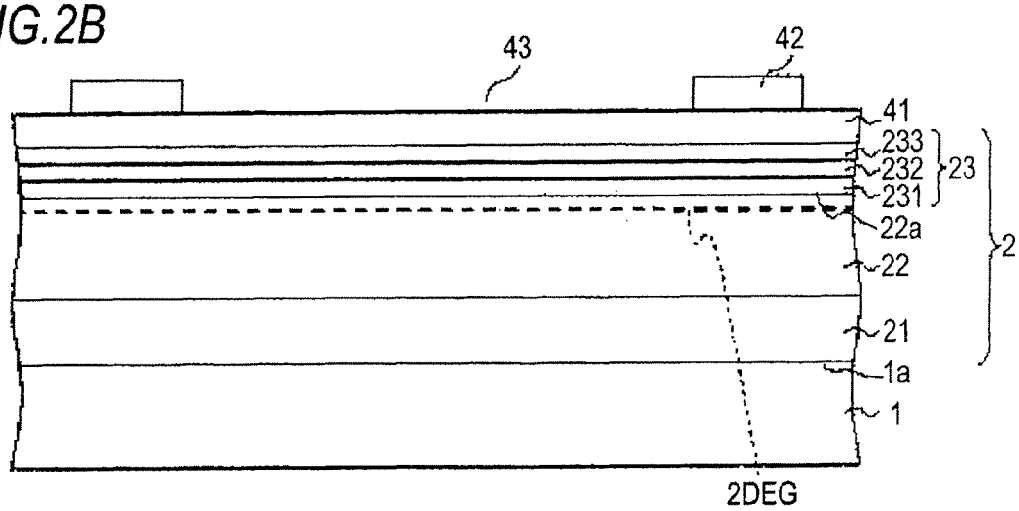

Then, as shown in FIG. 2B, a metal film 41 and a resist 42 are formed on the third layer 233. The metal film 41 is formed on the third layer 233 by a sputtering method, for example, and the metal film 41 has a multilayer of titanium (Ti) and aluminum (Al), each of which has a uniform thickness. Specifically, a Ti film is formed with the thickness of about 25 nm on the third layer 233, and an Al film is formed with the thickness of about 300 nm on the Ti film. The resist 42 is formed on the metal film 41 to have a predetermined opening 31 by well-known photolithography and etching. A portion of the metal film 41 is exposed by the opening 43.

Figure 2C:
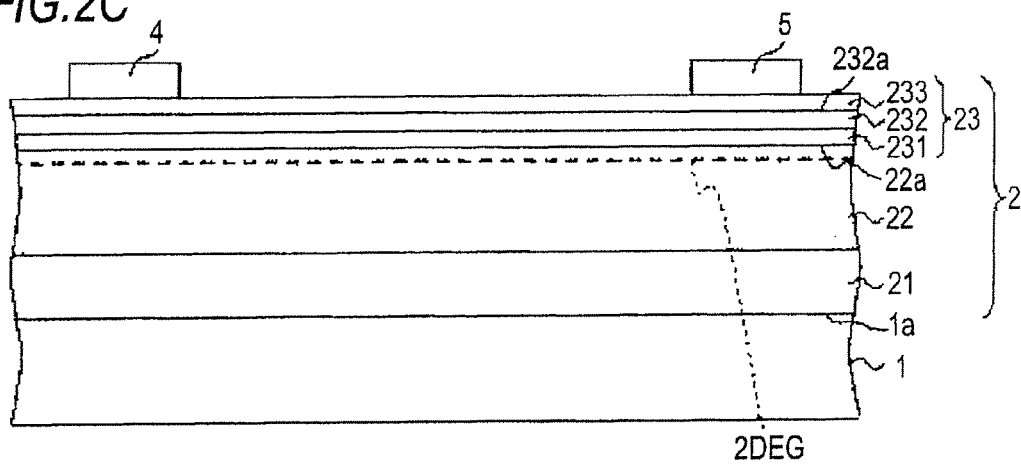

Then, as shown in FIG. 2C, the source electrode 4 and the drain electrode 5 are formed on the third layer 233. The metal film 41 exposed by the opening 43 is patterned by anisotropic etching such as reactive ion etching (RIB). The source electrode 4 and the drain electrode 5 are formed by removing the resist 42. The metal film 41 may be patterned by wet-etching or a lift-off method.

Figure 2D:
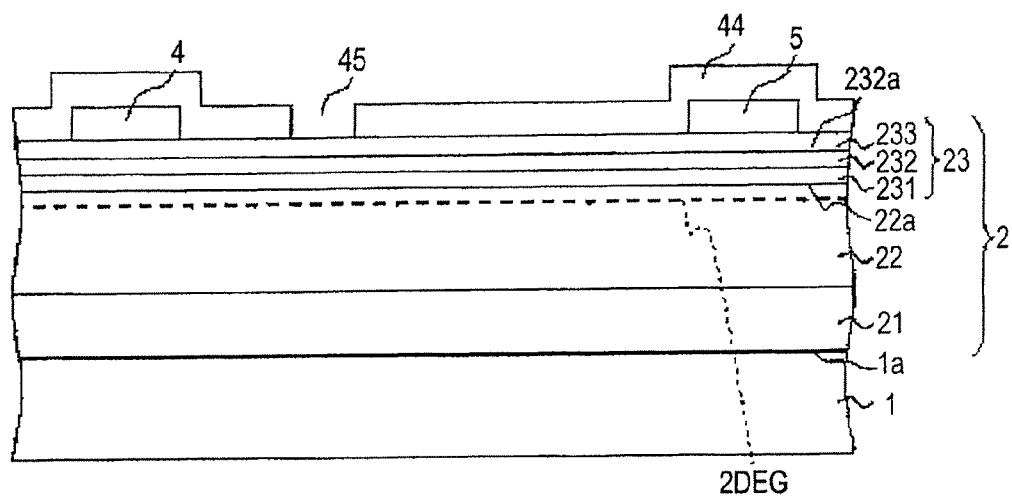

Then, as shown in FIG. 2D, a mask 44 is formed to cover the third layer 233, the source electrode 4 and the drain electrode 5. The mask 44 is made of silicon dioxide ($SiO_2$), and has a predetermined opening 45. The mask 44 is formed by anisotropic etching using photolithography and fluorine gas. A portion to be formed the recess portion 3 of the third layer 233 is exposed by the opening 45.

Figure 2E:
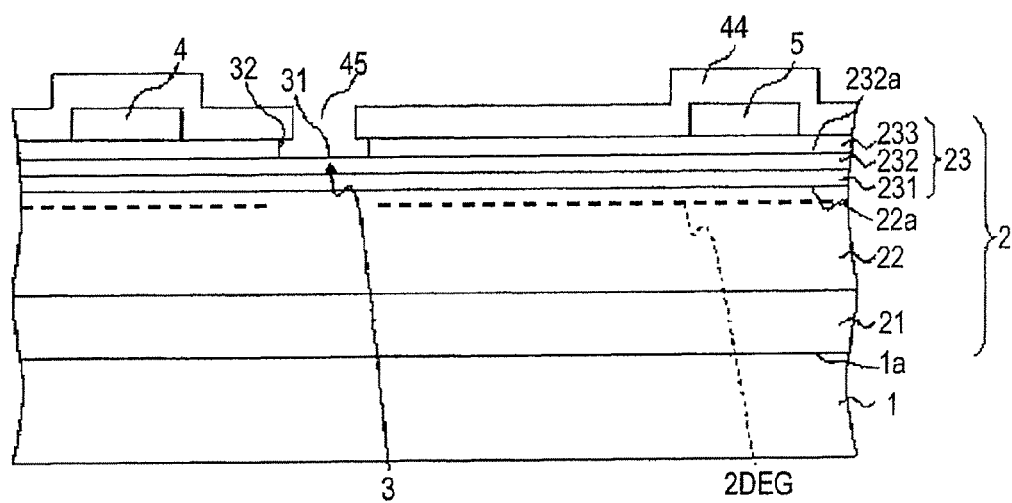

Then, as shown in FIG. 2E, the recess portion 3 is formed on the carrier supply layer 23. The recess portion 3 penetrates the third layer 233. The recess portion is formed to expose the main surface 232a of the second layer 232 at the bottom portion 31. The recess portion 3 is formed by wet-etching. The etching agent for the wet-etching in this illustrative aspect is an alkaline agent, that has selectivity with respect to a group-III nitride semiconductor such as GaN or AlGaN. an alkaline agent containing one of tetramethylammonium hydroxide (TMAH; $(CH_3)4NOH$), potassium hydroxide (KOH), and sodium hydroxide (NaOH) is used. In this illustrative aspect, TMAH is used for the wet-etching. These alkaline agents have a higher etch rate for planes other than the C-plane of the group-III nitride semiconductor, and are easy to etch the group-III nitride semiconductor having a high Al composition ratio such as AlN. The alkaline agents are preferably used in a temperature between about 50 to 100 degrees C. With the multilayer structure of the carrier supply layer 23 as explained above, the third layer 233 with the higher Al composition is etched horizontally and vertically, and the second layer 232, which does not contain Al, is little etched. Therefore, the bottom portion 31 of the recess portion 3 becomes consistent with the main surface 232a of the second layer 232, and the side face 32 is formed to set back from the side face of the opening 45. If the cap layer made of GaN is formed on the third layer 233 as described above, it is preferable to perform RIE with chlorine (Cl) gas before the wet-etching to form an opening at the cap layer.

The process illustrated in FIGS. 2D and 2E are referred to as the recess portion forming step according to the present invention.

Figure 2F:
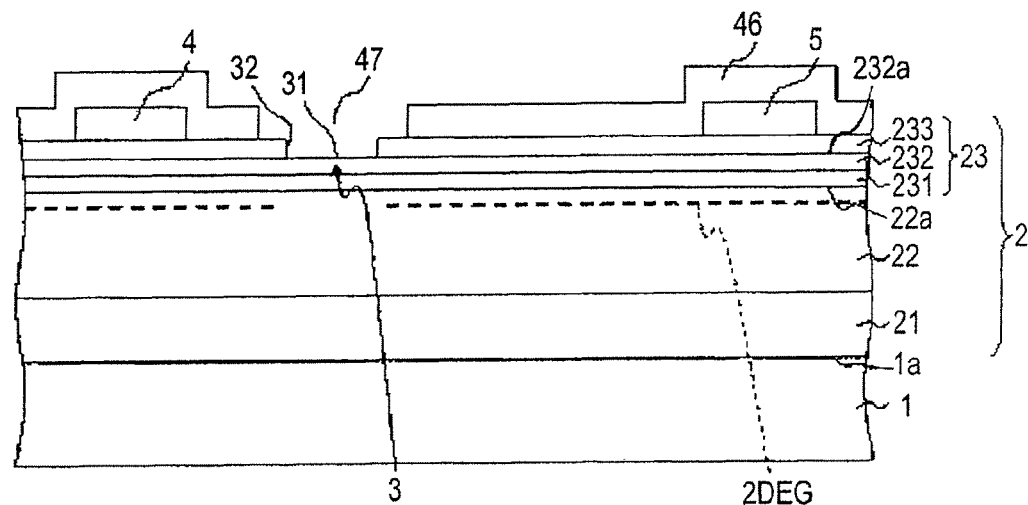

Then, as shown in FIG. 2F, after the recess portion 3 is formed, the mask 44 is removed, and a resist 46 is formed to cover the third layer 233, the source electrode 4, and the drain electrode 5. The resist 46 has a predetermined opening 47, and is formed by photolithography and etching similar to the resist 42. The opening 47 is exposed by the recess portion 3, and a portion of the third layer 233 around the recess portion 3.

Figure 2G:
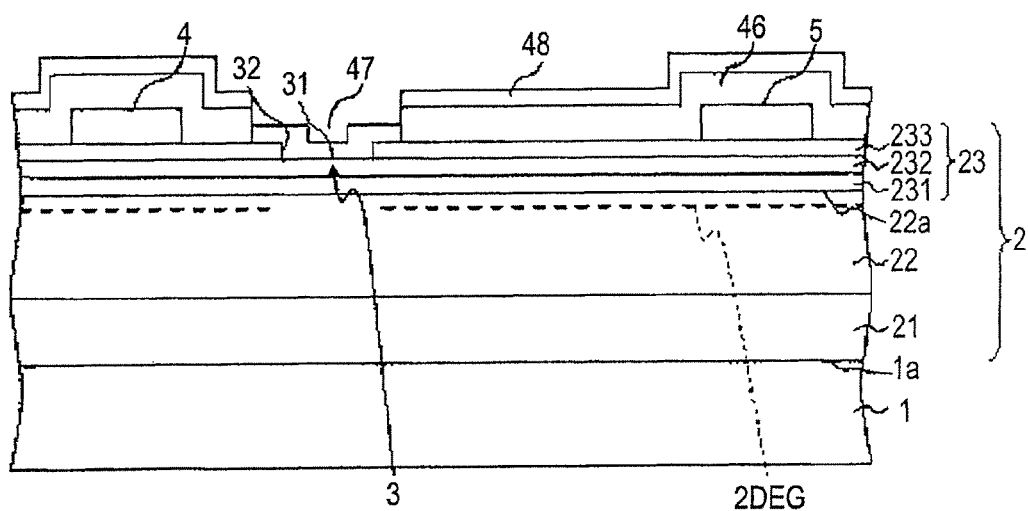
Figure 4:
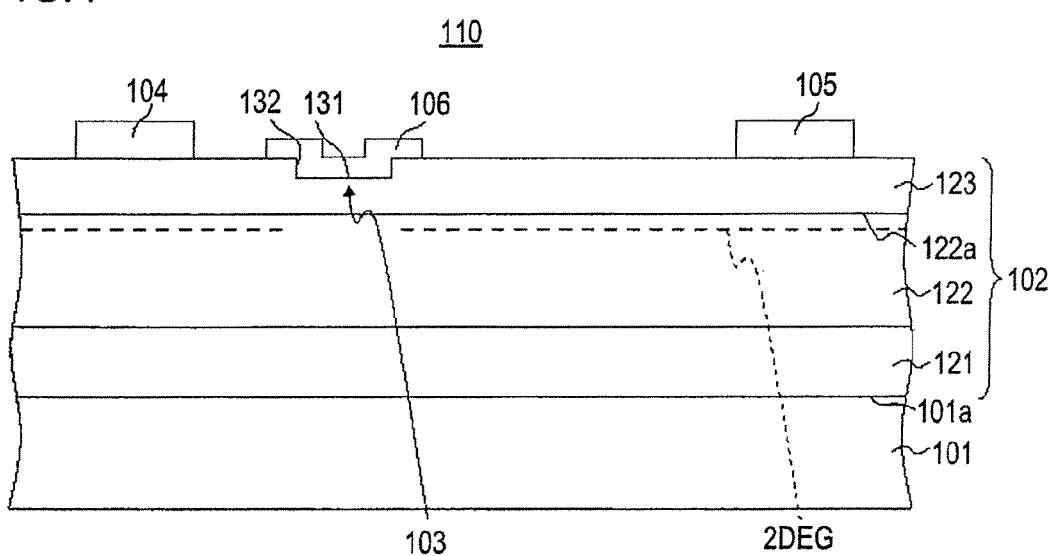
FIG. 4 is a sectional view illustrating the structure of a HEMT 10 according to the related art.

Then, as shown in FIG. 2G, a metal film 48 is formed to cover the second layer 232, the third layer 233 and the resist 46. The metal film 48 is formed by, for example, the sputtering method, and has a multilayer of nickel (Ni) and gold (Au) each of which has a uniform thickness. Specifically, a Ni film is formed with the thickness of about 30 nm on the second layer 232, the third layer 233 and the mask 46, and an Au film is formed with the thickness of about 300 nm on the Ti film. After that, the metal film on the resist 46 is removed with the resist 46. In other words, the gate electrode 6 is formed by a lift-off method, and the HEMT 10 is acquired as shown in FIG. 1.

The nitride semiconductor device includes the carrier transit layer 22, which has a composition represented by the formula: $Al_{x1}In_{x2}Ga_{1-x1-x2}N$, ($0 \leq x1 < 1$, $0 \leq x2 \leq 1$, $0 \leq (x1+x2) \leq 1$); the carrier supply layer 23; and the recess portion 3 penetrating the first layer 231 and exposing the main surface 232a of the second layer 232. The carrier supply layer 23 includes the first layer 231 formed on the carrier transit layer 22 and having a composition represented by the formula: $Al_yGa_{1-y}N$, ($0 < y \leq 1$, $x1 < y$); the second layer 232 formed on the first layer 231 and made of GaN; the third layer 233 formed on the second layer 232 and having a composition represented by the formula: $Al_zGa_{1-z}N$ ($0 < z \leq 1$, $x1 < z$).

The thickness of the portion of the carrier supply layer 23 provided between the bottom portion of the recess portion 3 and the carrier transit layer depends on a condition of MOCVD rather than a condition of etching. In other words, since the composition and thickness of the carrier supply layer 23 is accurately formed, the variation of the threshold value of the HEMT, which is caused by a non-uniform thickness of the carrier supply layer 23, may be prevented. Moreover, the recess portion 3 is formed by the wet-etching using an alkaline agent in the recess portion forming step. Because the main surface 232a of the second layer 232 is a C-plane of GaN, damages such as crystal defects from the wet-etching are hardly caused at the bottom portion 31 of the recess portion 3. Thus, when the HEMT 10 is operated, the leakage current flowing through the gate electrode 6 is suppressed, and a low-loss nitride semiconductor device may be achieved.

Because the first and third layers 231 and 233 have a higher Al composition than the carrier transit layer 22, the carrier density of the 2DEG can be increased, except for a portion right under the recess portion 3. Therefore, the on-resistance of the HEMT 10 is reduced, and a low-loss nitride semiconductor can be achieved.

[Second Illustrative Aspect]

FIGS. 3A to 3C are procedural sectional views illustrating a method of manufacturing the HEMT 10' according to second illustrative aspect of the present invention. The method of manufacturing the nitride semiconductor device according to the present invention includes a nitride semiconductor forming step, a reformed area forming step, and a recess portion forming step.

First, the structure illustrated in FIG. 2D is acquired by the same process as the method of manufacturing the nitride semiconductor according to first illustrative aspect. Specifically, there are acquired a substrate 1; a nitride semiconductor layer 2 including a buffer layer 21 formed on the substrate 1, a carrier transit layer 22 and a carrier supply layer 23; a source electrode 4 and a drain electrode 5 that are formed on a third layer 233 of the carrier supply layer 23; and a mask 44 having a predetermined opening 45.

Then, as shown in FIG. 3A, a reformed area 233' is formed adjacent to the surface of the third layer 233 exposed by the opening 45. The reformed area 233' is an area where a large amount of crystal defects is introduced on the third layer 233, and may be acquired by performing RIE onto the mask 44, as illustrated with arrows in the drawing. Meanwhile, because the propose of the RIE in this process for forming the reformed area is not to etch the third layer 233, it is preferable to use an inert gas such as nitrogen ($N_2$) or argon (Ar) rather than chlorine (Cl) gases. The reformed area 233' may be formed by performing ion implantation of, for example, $N_2$ or Ar, instead of performing RIE.

The process illustrated in FIG. 3A is referred to as the reformed area forming step according to the present invention.

Then, a recess portion 3' is formed on the carrier supply layer 23 as shown in FIG. 3B. Similarly to the recess portion 3 in first illustrative aspect, the recess portion 3' is formed by wet-etching using TMAH, and the recess portion 3' is formed to penetrate the third layer 233 and to exposes the main surface 232a of the second layer 232 at the bottom portion 31 of the recess portion 3'. Meanwhile, since the reformed area 233' formed in the carrier supply layer 23 is easily etched than the second layer 232, the time period taken for the etching process is reduced, compared with that of the recess portion forming step according to first illustrative aspect. Furthermore, due to the shortened process time, the set-back width of the side 32' of the recess portion 3' is reduced than that of the side face 32 of the recess portion 3 in first illustrative aspect. Accordingly, the portion right under the recess portion, where the 2DEG is split, can be narrowed.

Then, as shown in FIG. 3C, a HEMT 10' is acquired as a nitride semiconductor device according to this illustrative aspect. A gate electrode 6' is formed by a lift-off method as shown in FIGS. 2F and 2G, similarly to the gate electrode 6 in first illustrative aspect. However, a contact square between the gate electrode and the second layer is smaller than that of the HEMT 10 according to first illustrative aspect, because the set-back width of the side 32' of the recess portion 3' is narrower as described above.

The technical benefits, which may be achieved from the process for manufacturing a nitride semiconductor device according to the second illustrative aspect, will be described. The manufacturing method of the nitride semiconductor device according to the aspect includes the process for forming the reformed area. Because the reformed area 233', which contains many damages such as crystal defects, is formed on the third layer 233 by the same mask used for wet-etching, the time taken for the wet-etching process becomes shorter. In other words, because the horizontal etching of the third layer 233 is performed in a shorter time period, and the width of the opening of the recess portion 3' is narrower, and thus the gate length of the HEMT 10', which is referred to as Lg in the drawing, becomes shorter. Therefore, the manufacturing process of the nitride semiconductor according to this illustrative aspect not only achieves the same effects of the method of manufacturing the nitride semiconductor according to first illustrative aspect, but also improves the frequency performance of the HEMT 10' and enables a miniaturization of a gate structure.

(Modified Aspect)

The present invention herein has been explained with a few aspects, but is not limited to these specific aspects. The present invention may be changed, or modified, within the scope of the invention. Moreover, the semiconductor device having the recess portion may be not a HEMT with the channel of a two-dimensional hole gas layer, but also, for example, a metal-insulator-semiconductor field-effect transistor (MISFET), a schottky barrier diode (SBD), or a complex device thereof.

What is claimed is:

1. A method of manufacturing a nitride semiconductor device, which comprises: a substrate; a nitride semiconductor layer formed on the substrate and having a heterojunction interface; and a recess portion formed on the nitride semiconductor layer, the method comprising;
   forming the nitride semiconductor layer by:
   forming a carrier transit layer, which has a composition represented by the formula:

$Al_{x1}In_{x2}Ga_{1-x1-x2}N$, wherein x1 satisfies $0 \leq x1 < 1$,
   wherein x2 satisfies $0 \leq x2 \leq 1$,
   wherein x1+x2 satisfies $0 \leq x1+x2 \leq 1$; and
   forming a carrier supply layer by:
   forming a first layer on the carrier transit layer, said first layer having a composition represented by the formula:

$Al_y Ga_{1-y}N$, wherein y satisfies $0 < y \leq 1$ and $x1 < y$;

forming a second layer formed on the first layer, said second layer containing GaN; and
   forming a third layer formed on the second layer, said third layer having a composition represented by the formula:

$Al_z Ga_{1-z}N$, wherein z satisfies $0 < z \leq 1$ and $x1 < z$, forming the recess portion to penetrate the third layer and expose a main surface of the second layer at a bottom portion of the recess portion, and
   forming a gate electrode on the exposed main surface of the second layer at the bottom portion of the recess portion.

2. The method according to claim 1,
wherein the recess portion forming further comprises:
wet-etching the third layer with an alkaline agent.

3. The method according to claim 2,
wherein the alkaline agent is a solution comprising one of tetramethylammonium hydroxide, potassium hydroxide, and sodium hydroxide.

4. The method according to claim 1, further comprising:
forming a reformed area to be introduced of crystal defects at the third layer before the forming the recess portion.

5. The method according to claim 1,
wherein the third layer has a composition represented by the formula:

$Al_z Ga_{1-z}N$, wherein z satisfies $0 < z \leq 1$ and $y \leq z$.

6. The method according to claim 1,
wherein the gate electrode is formed in the recess portion so as to contact the second layer at the bottom portion of the recess portion and to be adjacent to the third layer at a side face of the recess portion.

7. A nitride semiconductor device comprising:
a substrate;
a nitride semiconductor layer formed on the substrate and having a heterojunction interface; and
a recess portion formed on the nitride semiconductor layer,
wherein the nitride semiconductor layer comprises:
   a carrier transit layer, which has a composition represented by the formula:

$Al_{x1}In_{x2}Ga_{1-x1-x2}N$, wherein x1 satisfies $0 \leq x1 < 1$,
   wherein x2 satisfies $0 \leq x2 \leq 1$,
   wherein x1+x2 satisfies $0 \leq x1+x2 \leq 1$; and
   a carrier supply layer comprising:
      a first layer formed on the carrier transit layer, said first layer having a composition represented by the formula:

$Al_y Ga_{1-y}N$, wherein y satisfies $0 < y \leq 1$ and $x1 < y$;

a second layer formed on the first layer, said second layer containing GaN; and
      a third layer formed on the second layer, said third layer having a composition represented by the formula:

$Al_z Ga_{1-z}N$, wherein z satisfies $0 < z \leq 1$ and $x1 < z$, wherein the recess portion is formed to penetrate the third layer and expose a surface of the second layer at a bottom portion of the recess portion, and
wherein the device further comprises a gate electrode formed on the exposed surface of the second layer at the bottom portion of the recess portion.

8. The device according to claim 7,
wherein the recess portion is formed by wet-etching with an alkaline agent.

9. The device according to claim 8,
wherein the alkaline agent is a solution comprising one of tetramethylammonium hydroxide, potassium hydroxide, and sodium hydroxide.

10. The device according to claim 7, wherein:
the gate electrode is formed in the recess portion, and
wherein the gate electrode contacts the second layer at the bottom portion of the recess portion, and the gate electrode is adjacent to the third layer at a side face of the recess portion.

* * * * *